United States Patent
Armitage (10) Patent No.: US 8,247,791 B2
(45) Date of Patent: Aug. 21, 2012

(54) COMPOUND SEMICONDUCTOR LIGHT EMITTING ELEMENT, ILLUMINATING APPARATUS USING COMPOUND SEMICONDUCTOR LIGHT EMITTING ELEMENT, AND METHOD FOR MANUFACTURING COMPOUND SEMICONDUCTOR LIGHT EMITTING ELEMENT

(75) Inventor: Robert David Armitage, Goleta, CA (US)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 12/993,509

(22) PCT Filed: May 25, 2009

(86) PCT No.: PCT/JP2009/059504
§ 371 (c)(1),
(2), (4) Date: Nov. 19, 2010

(87) PCT Pub. No.: WO2009/145131
PCT Pub. Date: Dec. 3, 2009

(65) Prior Publication Data
US 2011/0062453 A1    Mar. 17, 2011

(30) Foreign Application Priority Data
May 26, 2008    (JP) .................................. 2008-137220

(51) Int. Cl.
*H01L 29/06* (2006.01)
*H01L 21/00* (2006.01)

(52) U.S. Cl. .............. 257/13; 257/95; 257/98; 257/432; 257/E31.127; 438/29; 438/65

(58) Field of Classification Search .................. None
See application file for complete search history.

(56) References Cited

U.S. PATENT DOCUMENTS 7,132,677 B2 * 11/2006 Kim et al. ..................... 257/14
7,906,354 B1 * 3/2011 Ellinger et al. ................ 438/26
(Continued)

FOREIGN PATENT DOCUMENTS

| EP | 1796180 | 6/2007 |
|---|---|---|
| JP | 2005-228936 | 8/2005 |
| JP | 2005-268783 | 9/2005 |
| JP | 2007-123398 | 5/2007 |

OTHER PUBLICATIONS

Search report from E.P.O. that issued with respect to patent family member European Patent Application No. 09754639.4, mail date is May 30, 2011.

*Primary Examiner* — Alonzo Chambliss
(74) *Attorney, Agent, or Firm* — Greenblum & Bernstein, P.L.C.

(57) ABSTRACT

A compound semiconductor light emitting element is provided with a substrate which is provided on a side of one electrode; a plurality of columnar crystal structures of nanometer scale extending in a vertical direction on the substrate; and another electrode which interconnects top portions of the plurality of columnar crystal structures. On the substrate are provided a first region, and a second region having a step between the first region and the second region and having a substrate thickness greater than that in the first region; a porous first mask layer is formed on the surface of the first region on the substrate; and the plurality of columnar crystal structures are formed by sequentially layering an n-type semiconductor layer, a light emitting layer, and a p-type semiconductor layer, in the first and second regions on the substrate.

10 Claims, 7 Drawing Sheets

U.S. PATENT DOCUMENTS

| | | |
|---|---|---|
| 2005/0082543 A1* | 4/2005 | Alizadeh et al. ............... 257/79 |
| 2005/0208752 A1 | 9/2005 | Colburn et al. |
| 2005/0272341 A1 | 12/2005 | Colburn et al. |
| 2006/0223211 A1* | 10/2006 | Mishra et al. .................. 438/41 |
| 2007/0248132 A1 | 10/2007 | Kikuchi et al. |
| 2010/0207136 A1 | 8/2010 | Armitage et al. |
| 2011/0012168 A1 | 1/2011 | Armitage |
| 2012/0088348 A1* | 4/2012 | Sandhu ....................... 438/381 |

* cited by examiner

COMPOUND SEMICONDUCTOR LIGHT EMITTING ELEMENT, ILLUMINATING APPARATUS USING COMPOUND SEMICONDUCTOR LIGHT EMITTING ELEMENT, AND METHOD FOR MANUFACTURING COMPOUND SEMICONDUCTOR LIGHT EMITTING ELEMENT

TECHNICAL FIELD

This invention relates to a compound semiconductor light emitting element which causes electrons and holes to recombine and cause light emission within a compound semiconductor, to an illuminating apparatus using such a compound semiconductor light emitting element, and to a method for manufacturing a compound semiconductor light emitting element, and in particular relates to a compound semiconductor light emitting element having a plurality of columnar crystal structures called nano-columns or nano-rods.

BACKGROUND ART

In recent years, there has been remarkable progress in light emitting elements in which a nitride semiconductor (hereafter called a "nitride") is used to form a light emitting layer therewithin, a current is injected from the outside, and electrons and holes are caused to recombine and cause light emission within the light emitting layer. Further, applications in illuminating apparatuses are attracting attention, in which a portion of the light emitted from the light emitting element is used to excite a phosphor, and the white light obtained by mixing the light occurring due to the phosphor and the light from the light emitting element is used as a light source. However, as yet a device which satisfies requirements for high efficiency has not been obtained. The reasons for this, particularly when focusing on the process of obtaining white light using a phosphor, are principally two factors which lower the efficiency.

The first factor lowering the efficiency is the fact that a portion of the energy is lost due to wavelength conversion (Stokes loss). More specifically, excitation light emitted from the light emitting element, and absorbed by the phosphor, is wavelength-converted into light having an energy lower than the energy of the light arising from the light emitting element, and is emitted again to the outside. At this time, a loss occurs equal to the difference in the energies of the excitation light from the light emitting element and the emitted light from the phosphor, and so the efficiency is lowered.

The second factor lowering the efficiency is the reduced efficiency due to nonradiative recombination in the phosphor (the reduced internal quantum efficiency of the phosphor). More specifically, crystal defects existing within the phosphor function as nonradiative recombination centers. And, a portion of the carriers generated within the phosphor by excitation light are captured by the crystal defects without contributing to emission, and so cause a decline in the light emission efficiency of the phosphor.

Hence when a phosphor is used to obtain white light by passing through the two stages described above, a prominent decline in efficiency results, and impedes improvement of the efficiency of the light emitting element. The above explanation cites Patent Document 1, previously proposed by the present applicant. In addition, when a phosphor is used, hydrolysis due to moisture (a hydration reaction) occurs for sulfide system, silicate system, and halo-silicate system phosphors, and in addition rapid degradation occurs due to ultraviolet ray and other excitation light, so that there are the problems that reliability is poor and lifetimes are short. Further, when a phosphor is used there are the problems that color rendering and hues are lacking. That is, when realizing white light with high color rendering, at present the emission of red phosphors is weak, and there is a tradeoff between color rendering and light emission efficiency. On the other hand, in ultraviolet light emitting semiconductors, at present high-efficiency phosphors have not been obtained by a method of excitation of RGB three-color phosphors.

Hence among the current technology, there exist only methods using RGB three-color chips to realize white LEDs with high color rendering and high reliability. However, there are such problems as difficulty in designing an optical system in which color variation does not occur, and, with respect to cost, applying this technology to equipment including general-level illumination.

Hence this applicant proposes, by using the columnar crystal structures without using a phosphor to address the above-described technical problem, a compound semiconductor light emitting element capable of emission of multicolor light such as white light, made possible using a single chip. Specifically, by causing crystal growth of nuclei on a substrate at a temperature lower than the normal growth temperature of the columnar crystal structures, variation can be imparted to the nuclei. Thereafter, by causing growth of the columnar crystal structures in the usual way, variation can be imparted to the film thickness and composition of the light emitting layer as well, and the columnar crystal structures can be caused to emit light at different wavelengths. Patent Document 2 and similar describe growth of the columnar crystal structures.

A method of Patent Document 1 is an excellent method to realize a solid-state light source capable of multi-color light emission by a single simple growth process on the same substrate and at low cost. However, variation in growth is used to enable multi-color light emission, so that problems with precision arise when combining to obtain a desired hue, as in illumination applications and similar.

CITATION LIST

Patent Literature

Patent Document 1: Japanese Patent Laid-open No. 2007-123398
Patent Document 2: Japanese Patent Laid-open No. 2005-228936

SUMMARY OF INVENTION

An object of this invention is to provide a compound semiconductor light emitting element which can easily realize a desired hue at low cost, and which enables easy, minute and precise adjustment of hue, as well as an illuminating apparatus using such an element and a method for manufacturing a compound semiconductor light emitting element.

A compound semiconductor light emitting element according to one aspect of this invention comprises a substrate which is provided on a side of one electrode; a plurality of columnar crystal structures of nanometer scale extending in a vertical direction on the substrate; and another electrode which interconnects top portions of the plurality of columnar crystal structures; on the substrate are provided a first region, and a second region having a step between the first region and the second region and having a substrate thickness greater than that in the first region; a porous first mask layer is formed on the surface of the first region on the substrate; and the plurality of columnar crystal structures are formed by sequentially layering an n-type semiconductor layer, a light emitting layer, and a p-type semiconductor layer, in the first and second regions on the substrate.

By means of this configuration, in the first region in which is formed the porous first mask layer, the growth rate of columnar crystal structures is faster than in the second region not comprising a porous mask layer, so that heights can be made equal for the columnar crystal structures in the first region and the columnar crystal structures in the second region, and the top portions thereof can be interconnected by the other electrode. At this time, the columnar crystal structures of the first region are longer than the columnar crystal structures of the second region by the amount of the step height between the first region and the second region. Then, because the aspect ratios of the columnar crystal structures in the first region and in the second region are different, light of different wavelengths can be emitted in the first region and in the second region.

At this time, the aspect ratios of the columnar crystal structures can be set by adjusting the size of the step between the first region and the second region. And, the size of the step between the first region and the second region can easily be set with high precision using a well-known semiconductor process, so that the hue of the emitted light can easily be adjusted minutely and with high precision. Further, a desired hue can be realized using a single chip, so that compared with a case in which a plurality of chips are used, a desired hue can be realized at low cost.

Further, an illuminating apparatus according to one aspect of this invention uses the above-described compound semiconductor light emitting element.

By means of this configuration, even when a compound semiconductor light emitting element of a single type is used, an illuminating apparatus capable of realizing white light or another desired hue with high precision can be obtained.

Further, a method for manufacturing a compound semiconductor light emitting element according to one aspect of this invention comprises a process of forming, in a region of a portion of a substrate which is provided on a side of one electrode, a depressed area as a first region, to thereby form a step between the first region and a second region which is the remaining region; a process of forming a porous first mask layer in a bottom portion of the depressed area which is the first region; a growth process of sequentially layering, in the first and second regions, an n-type semiconductor layer, a light emitting layer, and a p-type semiconductor layer, and causing growth of a plurality of columnar crystal structures of nanometer scale to substantially the same height in the first region and the second region; and a connection process of connecting top portions of the plurality of columnar crystal structures by another electrode.

By means of this method, the above-described compound semiconductor light emitting element can be manufactured.

BRIEF DESCRIPTION OF THE DRAWINGS

FIG. 2 are used to explain specific processes in the manufacture of the light emitting diode shown in FIG. 1;

FIG. 3 are used to explain the structure of a mask layer which controls nano-column growth;

FIG. 4 are used to explain differences in growth rates of nano-columns due to the mask layer;

FIG. 7 are used to explain specific processes in the manufacture of the light emitting diode shown in FIG. 6.

DESCRIPTION OF EMBODIMENTS (Embodiment 1)

Figure 1:
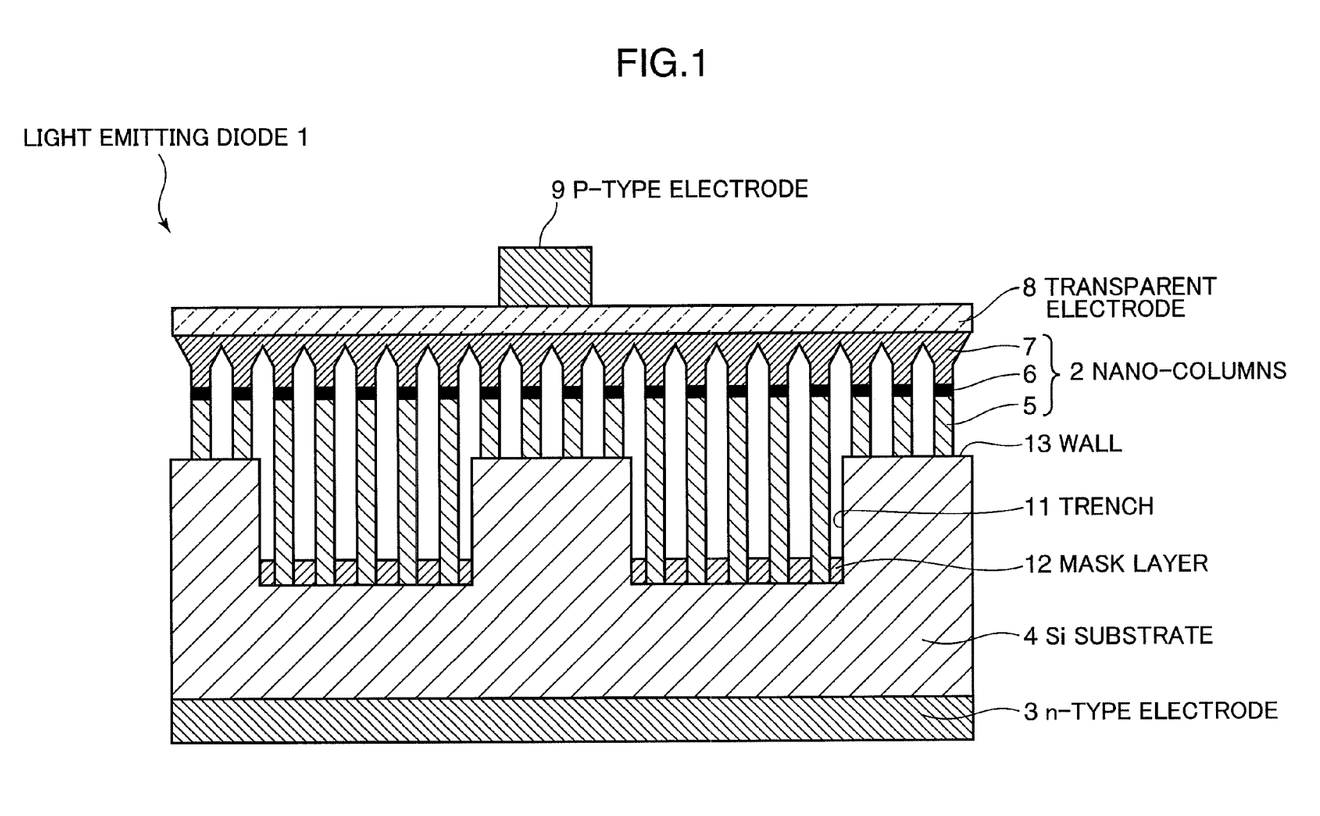
FIG. 1 is a cross-sectional view schematically showing the structure of a light emitting diode, which is the compound semiconductor light emitting element of one embodiment of the invention.

FIG. 1 is a cross-sectional view schematically showing the structure of a light emitting diode 1, which is the compound semiconductor light emitting element of one embodiment of the invention. In this embodiment, an example is used in which GaN is the material of the nano-columns 2 (columnar crystal structures); but other materials can be used, and all oxides, nitrides, oxynitrides, and other compound semiconductors are intended for use. The growth of nano-columns 2 is assumed to be induced using a molecular beam epitaxy (MBE) apparatus, but it is well known that nano-columns 2 can also be grown using a metalorganic chemical vapor deposition (MOCVD) apparatus, a hybrid vapor phase epitaxy (HVPE) apparatus, or similar. Below, unless specified otherwise, an MBE apparatus is assumed to be used.

In this light emitting diode 1, a plurality of the nano-columns 2 are formed on the side of the n-type electrode 3, which is one of the electrodes, of the Si substrate 4 by sequentially layering an n-type semiconductor layer 5, a light emitting layer 6, and a p-type semiconductor layer 7. Further, by connecting the top portions of the nano-columns 2 using a transparent electrode 8 and p-type electrode 9 which are the other electrode, a GaN nano-column LED is formed. It should be noted that in this embodiment, a trench 11 which is a depressed area (first region) is formed in the region of a portion of the Si substrate 4, and that within this trench 11, a mask layer 12 (first mask layer) which controls (promotes) growth of the nano-columns 2 is formed.

Figure 2A:
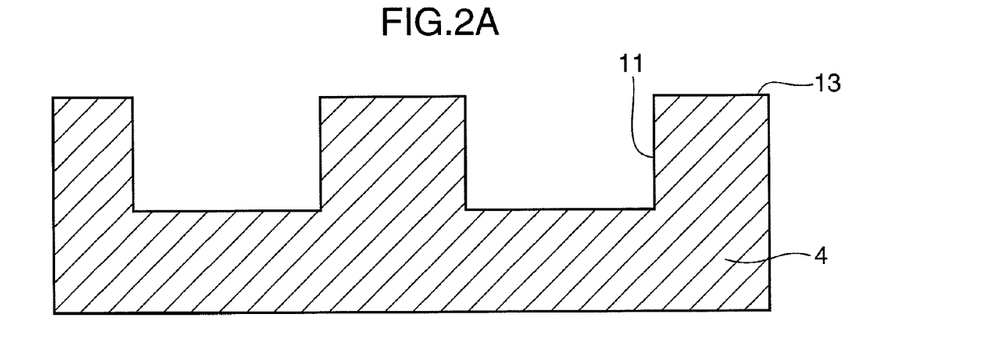
FIG. 2A is a cross-sectional view showing a state that trenches are formed on an Si substrate in the manufacturing process of a light emitting diode shown in FIG. 1.
Figure 2B:
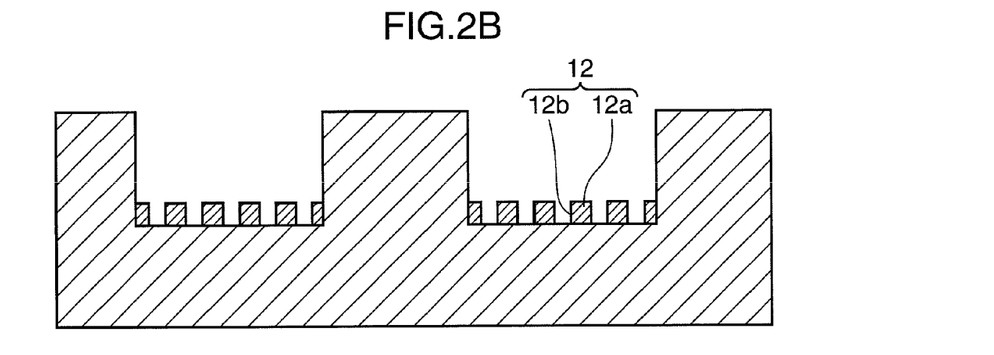
FIG. 2B is a cross-sectional view showing a state that a mask layer is formed in the trenches in the manufacturing process of a light emitting diode shown in FIG. 1.

FIG. 2 is used to explain specific processes in the manufacture of the light emitting diode 1 described above. First, an RIE apparatus is used to form trenches 11 such as those shown in FIG. 2A on the n-type Si substrate 4 having a plane direction (111). As the shape of the trenches, for example the width is W1=20 μm; the thickness of the walls 13, that is, the distance between trenches 11, is W2=40 μm; and the depth is H=300 nm. Next, a normal-pressure CVD apparatus is used to deposit an Si oxide film on the surface of the Si substrate 4 on which the trenches 11 have been formed, after which an ordinary lithography process and an RIE apparatus are used to remove the Si oxide film outside the trenches 11, that is, on the walls 13 (second region), leaving the Si oxide film only in the trenches 11, to be used as the mask layer 12 shown in FIG. 2B.

Figure 3A:
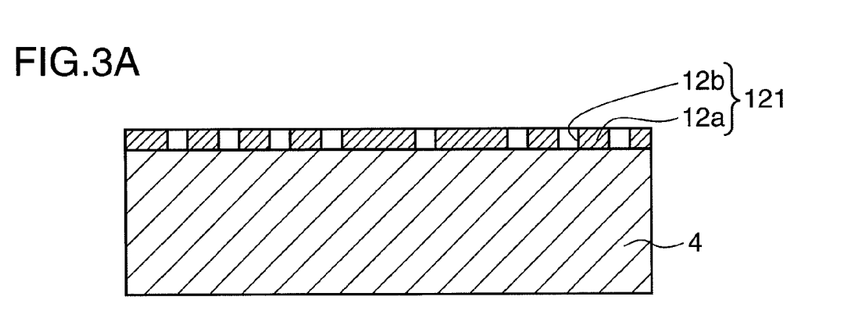
FIG. 3A is a cross-sectional view showing details of a mask layer formed in the trenches.
Figure 3B:
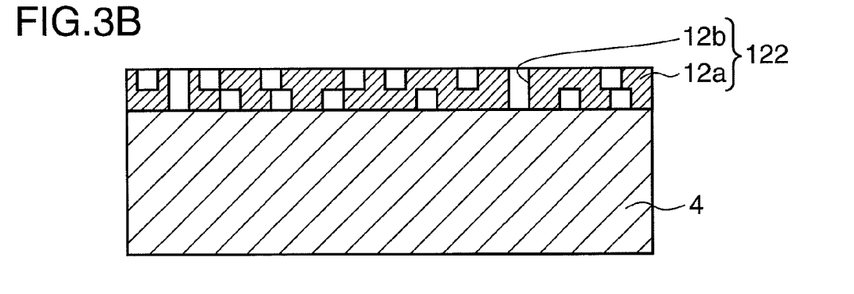
FIG. 3B is a cross-sectional view showing details of a mask layer in the case where the thickness of the mask layer is increased.
Figure 3C:
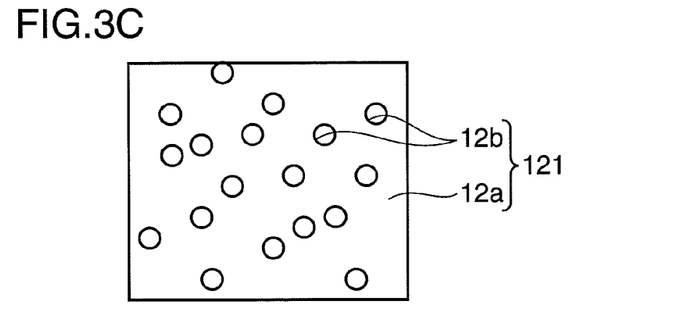
FIG. 3C is a top plan view of the mask layer shown in FIG. 3A.
Figure 3D:
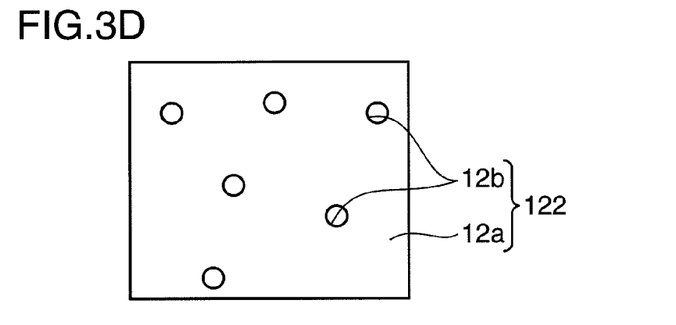
FIG. 3D is a top plan view of the mask layer shown in FIG. 3B.
Figure 4A:
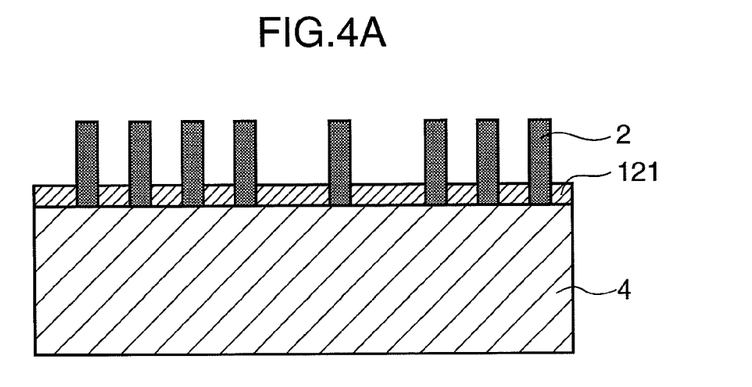
FIG. 4A is an explanatory diagram for explaining the growth of nano-columns on the mask layer shown in FIG. 3A.
Figure 4B:
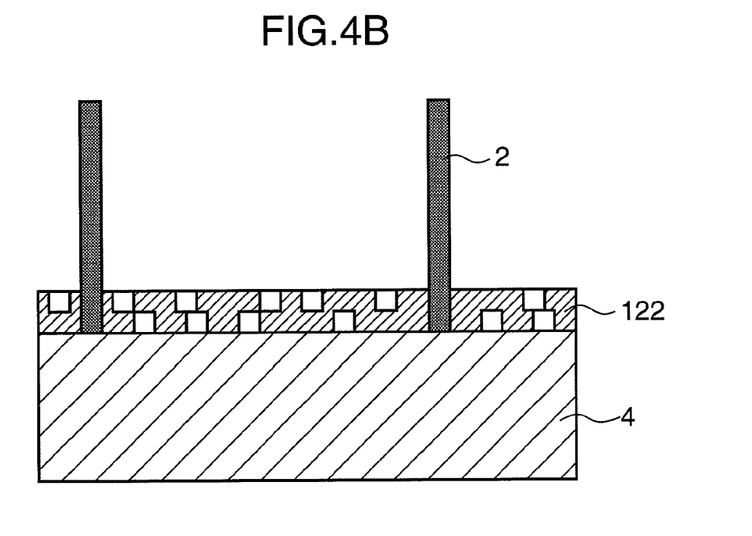
FIG. 4B is an explanatory diagram for explaining the growth of nano-columns on the mask layer shown in FIG. 3B.

More specifically, as indicated by the mask layer 121 of FIG. 3A, the Si oxide film 12a has inferior denseness compared with a thermal oxide film, and so is a porous film having penetrating holes 12b therewithin. And, the penetrating holes 12b exist randomly, so that as the thicker the Si oxide film 12a is made thicker, the number of penetrating holes 12b communicating with the surface of the Si substrate 4 decreases rapidly, as indicated by the mask layer 122 of FIG. 3B. FIG. 3C and FIG. 3D are views seen from above in FIG. 3A and FIG. 3B respectively. The thickness of the Si oxide film 12a is for example 5 nm in FIG. 3A and FIG. 3C, and 10 nm in FIG. 3B and FIG. 3D.

Figure 2C:
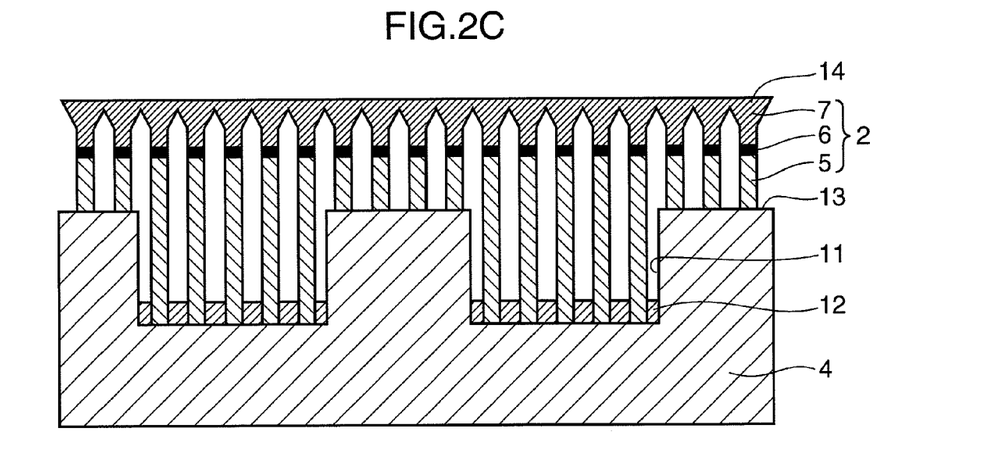
FIG. 2C is a cross-sectional view showing a state that nano-columns have grown on the Si substrate in the manufacturing process of a light emitting diode shown in FIG. 1.

After forming such a porous mask layer 12, the MBE apparatus is used to induce growth of the nano-columns 2 as shown in FIG. 2C. Specifically, in a vacuum of $2e^{-5}$ torr, with a substrate temperature of 750° C. and plasma output of 450 W, hydrogen gas ($H_2$) as the carrier gas, trimethyl gallium ($Ga(CH_3)_3$) as the Ga starting material, and ammonia ($NH_3$) as the nitrogen starting material, were supplied. Further, in order to add Si having n-type conductivity as an impurity, silane ($SiH_4$) was supplied. While affected by the growth conditions, for supply with Ga flux at a flow rate of 3.4 nm/min, when the thickness of the Si oxide film 12a is 10 nm, the n-type semiconductor layer 5 grows within the trench 11 at a growth rate approximately five times that on the walls 13, and upon inducing growth for approximately 24 minutes, the heights of the n-type semiconductor layer 5 in the trench 11 and the n-type semiconductor layer 5 on the walls 13 were substantially equal.

The reason for the faster growth of the n-type semiconductor layer 5 of the nano-columns 2 in the trenches 11 compared with on the walls 13 is thought to be as follows. Nuclei for growth of nano-columns 2 do not grow on the Si oxide film 12a, so that, for example in the case of growth of GaN nano-columns, it is thought that Ga atoms and N atoms adsorbed onto the Si oxide film 12a are diffused on the Si oxide film 12a, arrive at GaN crystal nuclei within penetrating holes 12b, and contribute to the growth of GaN nano-columns. As a result, compared with the thin mask 121 shown in FIG. 3A, the thick mask 122 shown in FIG. 3B supplies a greater number of atoms contributing to growth by means of GaN crystal nuclei in penetrating holes 12b, and the growth rate of nano-columns 2 is more rapid. Hence comparing natural growth of nano-columns 2 on walls 13 without a mask 12 and growth in the trenches 11 having a mask 12 and in which the crystal nuclei density is low, a greater number of atoms contributing to growth are supplied by crystal nuclei in the trenches 11, so that as explained above, the growth rate of nano-columns 2 is faster. By changing the materials of the substrate 4 and mask layer 12, the adsorption probabilities and diffusion rates for each of the atoms change, so that the growth rates can be changed.

Next, the temperature of the substrate is lowered to 650° C., the impurity gas is changed from silane ($SiH_4$) to trimethyl indium ($In(CH_3)_3$), which is the In starting gas, and with the In flux flow rate at 10 nm/min, the light emitting layer 6, comprising an InGaN quantum well, is grown. The growth time is 1 minute. The Ga flux flow rate and plasma output are the same as during growth of the n-type semiconductor layer 5. Here it is important that the In flux rate be much greater than the Ga flux rate, and that the Ga flux rate be much smaller than the N flux rate. The light emitting layer 6 may be formed with an InGaN/GaN multiple quantum well structure as well. Further, a reflective film may be formed as appropriate within the n-type semiconductor layer 5.

The substrate temperature is then raised to 750° C., the impurity gas is changed from trimethyl indium ($In(CH_3)_3$) to cyclopentadienyl magnesium ($Mg(C_5H_5)_2$) containing Mg with p-type conductivity, and with the Mg flux flow rate at 1 nm/min and the Ga flux flow rate at 5 nm/min, the p-type semiconductor layer 7 is grown. The growth time is 4 minutes, and the plasma output is the same 450 W throughout growth of the nano-columns 2. During growth of this p-type semiconductor layer 7, by gradually changing the ammonia ($NH_3$) flow rate, the $H_2$ carrier gas flow rate, or the growth temperature, the diameters of the nano-columns 2 are gradually increased, and a planar type p-type layer 14 is formed.

Then, by evaporation deposition using an EB evaporation deposition apparatus, a layered p-type contact layer, in which are layered an Ni layer of thickness 3 nm and an ITO layer of thickness 10 nm, is formed as the transparent electrode 8 on the surface of the p-type layer 14 as shown in FIG. 1, and thereupon a p-type pad electrode comprising Au of thickness 500 nm is formed as the p-type electrode 9. Similarly, by evaporation deposition using an EB evaporation deposition apparatus, a layered n-type contact layer comprising a Ti layer of thickness 30 nm and an Au layer of thickness 500 nm, and the n-type electrode 3 comprising an n-type pad electrode, are formed on the rear face of the Si substrate 4, to complete the light emitting diode 1.

In this way, trenches 11 are formed in the region of a portion of the Si substrate 4, a porous mask layer 12 is formed to control (promote) growth of the nano-columns 2 within the trenches 11, and then, by inducing growth of the nano-columns 2, growth of the nano-columns 2 is faster in the region having the mask layer 12 than in the region on the walls 13 not having the mask layer 12. Hence when growth of the nano-columns 2 is induced for a prescribed time, the step between the trenches 11 and the walls 13 is absorbed, and the surface of the p-type layer 14 has substantially the same height. In this way, two or more kinds of nano-columns 2 having different heights, that is, different aspect ratios, with different wavelengths of maximum intensity in the spectrum of emitted light, can be formed.

Figure 5:
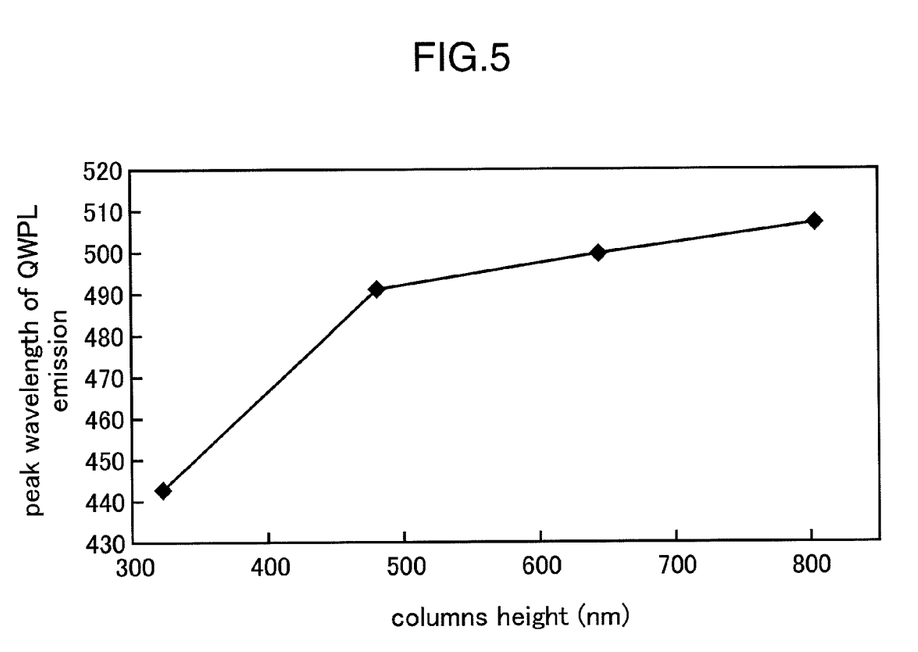
FIG. 5 is a graph showing differences in peak wavelengths with differences in the heights of nano-columns, showing experimental results of this applicant.

FIG. 5 shows results of experiments by this applicant. FIG. 5 is a graph showing the relation between the height (length) of nano-columns 2 and the peak wavelength, when the above-described composition was used to grow nano-columns 2 of diameter 300 nm. It is seen that the greater the height (length) of the nano-columns 2, that is, the greater the aspect ratio, the longer is the peak wavelength. The reason for longer peak wavelengths at greater aspect ratios as described above is as follows. First, the supply of atoms relating to the mechanism of GaN nano-column growth is determined by the adsorption/desorption processes and by the surface diffusion process. Below, a rough approximation is used to describe the mechanism of nano-column growth. Under the conditions of nano-column growth, in the case of Ga atoms the surface diffusion process is thought to be dominant. That is, Ga atoms are desorbed with a constant probability while diffusing from the base of a nano-column toward the tip. This desorption probability can be presumed to be proportional to the diffusion time.

On the other hand, for In atoms, with normal crystal growth the adsorption/desorption process to the quantum well layer is dominant. Hence as the heights (lengths) of nano-columns become higher (longer), the number of Ga atoms arriving at the quantum well layer decreases, whereas on the other hand In atoms are captured by the quantum well layer at a constant rate, regardless of the height of the nano-columns. As a result, the In/Ga ratio in the quantum well layer increases in proportion to the height, and as described above, the light emission wavelength changes to the long-wavelength side. Further, when the heights are the same and radii are different, the number of In atoms captured by the quantum well layer is proportional to the square of the nano-column radius. On the other hand, the number of Ga atoms is proportional to the nano-column radius. As a result, the In/Ga ratio increases in proportion to the radius. From the above, the In/Ga ratio determining the wavelength depends on the aspect ratio (height/radius) of the nano-columns: the greater the aspect ratio, the more there is a change to the long-wavelength side.

By applying this mechanism, an LED chip, which has wavelengths different between in the region having the mask layer 12 and in the region on the walls 13 not having the mask layer 12, can be formed on a single chip under the same growth conditions. And, by setting the lengths of the nano-columns 2 in each region such that the light on the long-wavelength side and light on the short-wavelength side of a straight line intersecting the white region of the CIE (Commission International de l'Eclairage) chromaticity diagram are respectively emitted, white light can be created. Further, by making the step into three steps, and setting the wavelengths at which maximum intensity is exhibited in the spectrum of light emitted by the nano-columns 2 in each of the regions to lengths such that light is emitted at wavelengths at the vertices of a triangle enclosing the white region in the CIE chromaticity diagram, white light can be created more reliably.

In this way, using the same Si substrate 4, and moreover using a single growth process, a solid-state light source can be fabricated which produces white light or another desired hue, by simple means and therefore at low cost. Further, a desired hue can be produced without using a phosphor, so that higher reliability and a longer lifetime can be achieved, and moreover the area of the mask layer 12 and the trench 11 can be adjusted arbitrarily, so that the hue can be adjusted minutely and precisely according to the needs of the user.

Further, by making the mask layer 12 an Si oxide film 12a, manufacture is easy, and the Si oxide film 12a has nanometer-order penetrating holes 12b and nano-columns 2 are not grown on the mask layer 12, so that such a film is suitable as the mask layer 12.

(Embodiment 2)

Figure 6:
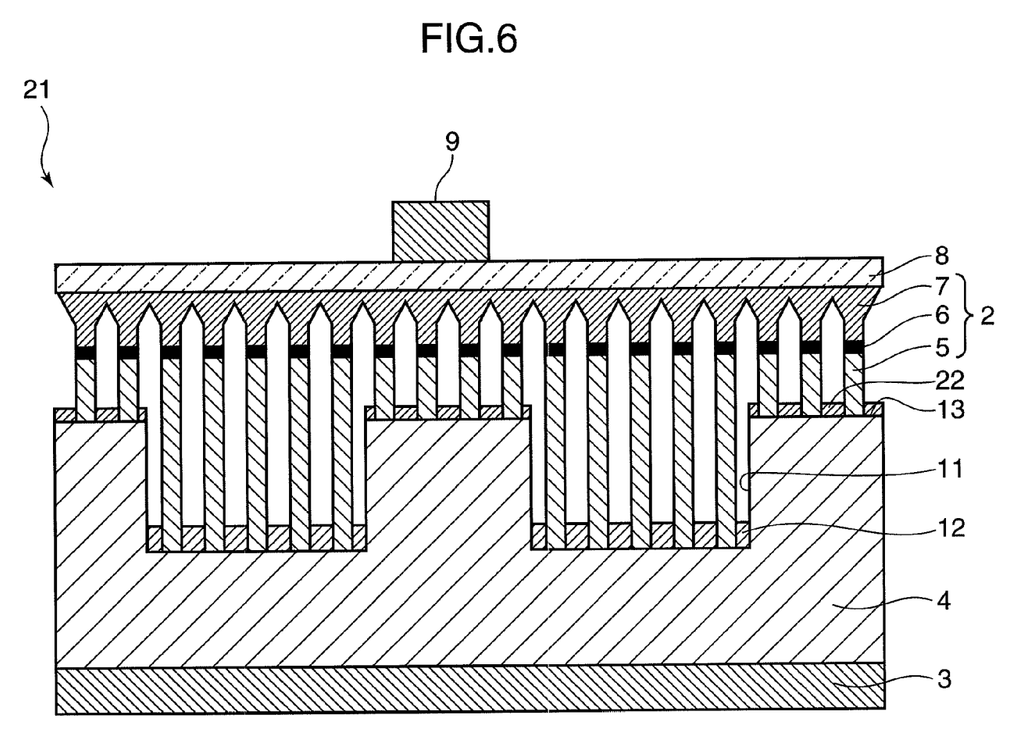
FIG. 6 is a cross-sectional view schematically showing the structure of a light emitting diode, which is the compound semiconductor light emitting element of another embodiment of the invention.
Figure 7A:
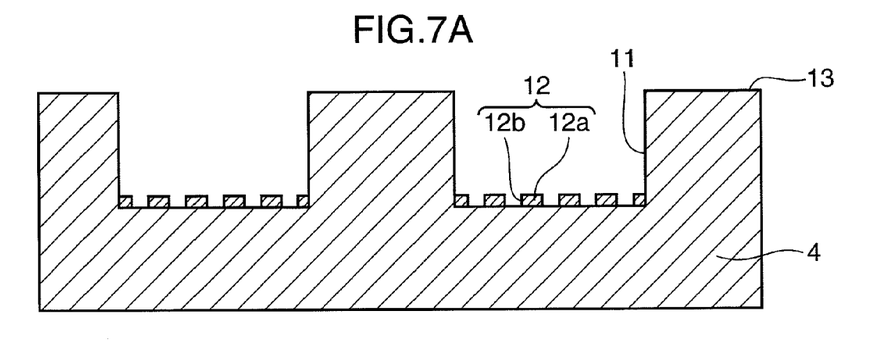
FIG. 7A is a cross-sectional view showing a state that a mask layer is formed in trenches in the manufacturing process of a light emitting diode shown in FIG. 6.
Figure 7B:
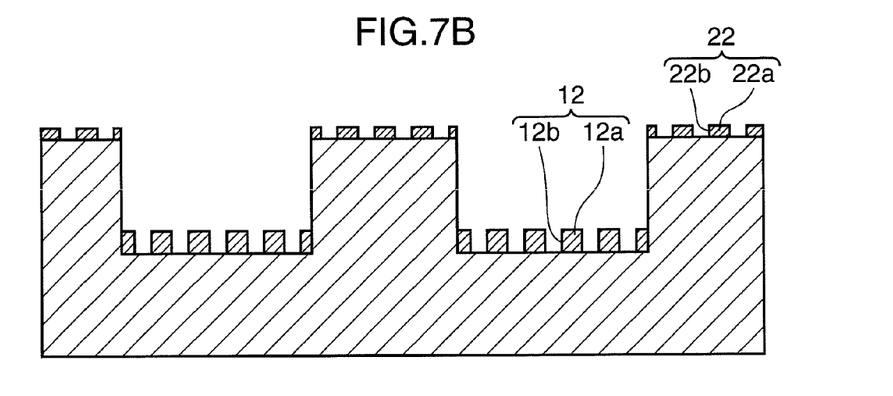
FIG. 7B is a cross-sectional view showing a state that a mask layer is formed in trenches and on walls in the manufacturing process of a light emitting diode shown in FIG. 6.
Figure 7C:
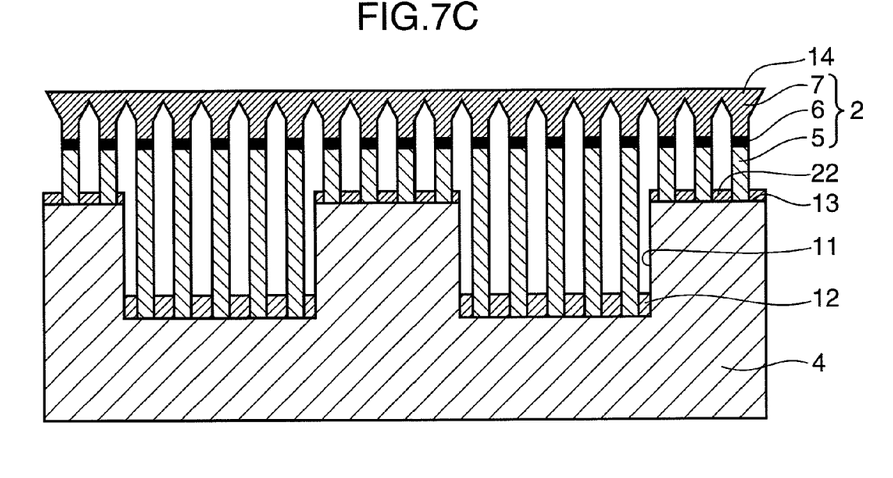
FIG. 7C is a cross-sectional view showing a state that nano-columns are grown on an Si substrate in the manufacturing process of a light emitting diode shown in FIG. 6.

FIG. 6 is a cross-sectional view schematically showing the structure of a light emitting diode 21, which is the compound semiconductor light emitting element of another embodiment of the invention, and FIG. 7 is used to explain specific processes in the manufacture of the light emitting diode 21 shown in FIG. 6. This light emitting diode 21 is similar to the above-described light emitting diode 1, and so corresponding portions are assigned the same reference symbols, and explanations thereof are omitted. It should be noted that in this light emitting diode 21, a mask layer 22 is also formed on the walls 13. When this mask layer 22 and the above-described mask layer 12 comprise the same material, the mask layer 22 is formed to be thin; the thickness may be selected such that the numbers of the penetrating holes 22b and the penetrating holes 12b result in a prescribed growth rate difference. Further, when different materials are comprised, the adsorption probabilities and diffusion rates change, as stated above, and so the thickness may be selected taking into account these and the desired growth rates.

As the method for forming the mask layers 12 and 22, first trenches 11 are formed on the Si substrate 4 as shown in FIG. 2A above, and then the normal-pressure CVD apparatus is used to deposit a 5 nm Si oxide film over the entire surface. Then, an ordinary lithography process and an RIE apparatus are used to remove the Si oxide film outside the trenches 11, that is, on the walls 13, leaving the Si oxide film 12a only in the trenches 11, as shown in FIG. 7A. Next, the normal-pressure CVD apparatus is again used to deposit 5 nm of an Si oxide film over the entire surface, so that 10 nm of the Si oxide film 12a is formed in the trenches 11, and 5 nm of the Si oxide film 22a is formed on the walls 13, as shown in FIG. 7B.

In this way, a mask layer 22 with numerous penetrating holes 22b is formed on the walls 13, and a mask layer 12 with few penetrating holes 12b is formed in the trenches 11, so that a difference in growth rates of nano-columns 2 can be imparted as described above.

By using a light emitting diode 1 and 21 configured as described above in an illuminating apparatus, it is possible to realize an illuminating apparatus which produces white light or another desired hue with high precision, even when using a single type of light emitting diode 1 or 21.

That is, the compound semiconductor light emitting diode according to one aspect of the invention comprises a substrate which is provided on a side of one electrode; a plurality of columnar crystal structures of nanometer scale extending in a vertical direction on the substrate; and another electrode which interconnects top portions of the plurality of columnar crystal structures; on the substrate are provided a first region, and a second region having a step between the first region and the second region and having a substrate thickness greater than that in the first region; a porous first mask layer is formed on the surface of the first region on the substrate; and the plurality of columnar crystal structures are formed by sequentially layering an n-type semiconductor layer, a light emitting layer, and a p-type semiconductor layer, in the first and second regions on the substrate.

By means of this configuration, in the first region in which is formed the porous first mask layer, the growth rate of columnar crystal structures is greater than in the second region not comprising a porous mask layer, so that the heights of the columnar crystal structures in the first region and the columnar crystal structures in the second region are made equal, and the top portions thereof can be interconnected by the other electrode. At this time, the columnar crystal structures of the first region are longer than the columnar crystal structures of the second region by the amount of the height of the step between the first region and the second region. Then, because the aspect ratios of the columnar crystal structures are different in the first region and in the second region, light of different wavelengths can be caused to be emitted in the first region and in the second region.

At this time, the aspect ratios of the columnar crystal structures in each of the regions can be set by adjusting the size of the step between the first region and the second region. And, the size of the step between the first region and the second region can be easily set with high precision by a well-known semiconductor process, so that the hue of the emitted light can easily be adjusted minutely and with high precision. Further, a desired hue can be produced using a single chip, so that compared with a case in which a plurality of chips are used, a desired hue can easily be produced at low cost.

Further, it is preferable that a porous second mask layer having a higher hole density than the first mask layer be formed on the surface of the second region on the substrate.

By means of this configuration, the growth rate of columnar crystal structures is slower in the second region, in which the porous second mask layer having a higher hole density than the first mask layer is formed, than in the first region. Hence the rates of growth of columnar crystal structures in the first region and in the second region can be adjusted such that the columnar crystal structures in the first region are longer by the amount of the step between the first region and the second region, so that the heights of the columnar crystal structures in the first region and the columnar crystal structures in the second region are made equal, and the top portions thereof can easily be interconnected by the other electrode.

Further, it is preferable that the first mask layer be an Si oxide film.

By means of this configuration, the first mask layer can easily be fabricated, and further, an Si oxide film has nanometer-order penetrating holes, and columnar crystal structures do not grow on the mask layer, so that such a film is suitable as the mask layer. And, the thinner the Si oxide film, the higher is the hole density. Hence by adjusting the thickness of the first mask layer, the growth rate of columnar crystal structures in the first region can be adjusted. In this case, the thickness of the first mask layer can easily be set using a well-known semiconductor process, so that the growth rate of columnar crystal structures in the first region can easily be adjusted.

Further, it is preferable that the first and second mask layers be Si oxide films, and that the second mask layer be thinner than the first mask layer.

The thinner an Si oxide film, the higher is the hole density. Hence by adjusting the thicknesses of the first and second mask layers, the hole densities in the first and second mask layers can be adjusted. And, the higher the hole density in a mask layer, the slower is the growth rate of columnar crystal structures, so that if the second mask layer is made thinner than the first mask layer, the growth rate of columnar crystal structures is slower in the second region than in the first region. By this means, the growth rates of the columnar crystal structures in the first region and in the second region can be adjusted such that the columnar crystal structures in the first region are longer by the amount of the step between the first region and the second region, so that the heights of the columnar crystal structures of the first region and of the columnar crystal structures of the second region can be made the same, and the top portions thereof can easily be interconnected by the other electrode. Further, the thicknesses of the first and second mask layers can easily be set by a well-known semiconductor process, so that fine adjustment of the growth rate of the columnar crystal structures can easily be performed.

Further, it is preferable that ratios of the lengths and thicknesses of the columnar crystal structures provided in the first and second regions be respectively set such that wavelengths at which maximum intensity is exhibited in a spectrum of light emitted from the columnar crystal structures provided in the first and second regions are wavelengths of colors positioned at both ends of a straight line intersecting a white region in a CIE chromaticity diagram.

By means of this configuration, substantially white light can be output by a single element.

Further, it is preferable that a third region, which is at least a portion of the remaining region of the substrate excluding the first and second regions and which has steps between the first and second regions and the third region, be provided in the other surface of the substrate, and that ratios of the lengths and thicknesses of the columnar crystal structures in the first, second, and third regions be set such that wavelengths at which maximum intensity is exhibited in a spectrum of light emitted from the columnar crystal structures provided in the first, second and third regions are wavelengths of colors positioned at the vertices of a triangle enclosing a white region in a CIE chromaticity diagram.

By means of this configuration, light still closer to the color white can be output by a single element.

Further, an illuminating apparatus according to one aspect of this invention uses the compound semiconductor light emitting element described above.

By means of this configuration, even when using a single type of compound semiconductor light emitting element, an illuminating apparatus capable of producing white light or other light of a desired hue with high precision can be obtained.

Further, the method for manufacturing a compound semiconductor light emitting element according to one aspect of this invention includes a process of forming, in a region of a portion of a substrate which is provided on a side of one electrode, a depressed area as a first region, to thereby form a step between the first region and a second region which is the remaining region; a process of forming a porous first mask layer in a bottom portion of the depressed area which is the first region; a growth process of sequentially layering, in the first and second regions, an n-type semiconductor layer, a light emitting layer, and a p-type semiconductor layer, and causing growth of a plurality of columnar crystal structures of nanometer scale to substantially the same height in the first region and the second region; and a connection process of connecting top portions of the columnar crystal structures by another electrode.

By means of this method, the above-described compound semiconductor light emitting elements can be manufactured.

Further, it is preferable that, prior to the growth process, a process of forming, on the surface of the second region, a porous second mask layer having a higher hole density than the first mask layer be further included.

By means of this method, a porous second mask layer having a higher hole density than the first mask layer is formed on the surface of the second region on the substrate.

Further, it is preferable that, when causing growth of the p-type semiconductor layer in the growth process, the p-type semiconductor layers in adjacent columnar crystal structures be caused to be joined together by gradually increasing the diameters of the plurality of columnar crystal structures, and that in the connection process, top portions of the plurality of columnar crystal structures be connected by forming a transparent electrode layer on a surface of a p-type layer formed with the p-type semiconductor layers joined together.

By means of this method, an electrode which interconnects the top portions of the plurality of columnar crystal structures can easily be fabricated.

The compound semiconductor light emitting element according to one aspect of the invention has, on a substrate which is provided on a side of one electrode, a plurality of columnar crystal structures of nanometer scale formed by sequentially layering an n-type semiconductor layer, a light emitting layer, and a p-type semiconductor layer, with the top portions of the plurality of columnar crystal structures connected by another electrode; and is characterized in that the substrate has a step, and in that on the substrate is provided a porous mask layer only in the region which is a depressed area of the step, or in that a region which is a depressed area of the step has a mask layer with fewer holes compared with a region which is a protruding portion.

Further, a method for manufacturing a compound semiconductor light emitting element of this invention is a method for manufacturing a compound semiconductor light emitting element having, on a substrate which is provide on a side of one electrode, a plurality of columnar crystal structures of nanometer scale formed by sequentially layering an n-type semiconductor layer, a light emitting layer, and a p-type semiconductor layer, with the top portions of the plurality of columnar crystal structures connected by another electrode; and is characterized in comprising a process of forming a depressed area in a region of a portion on the substrate, to thereby form a step between the region of the depressed area and the remaining region; a process of forming a porous mask layer only in the depressed area, or of forming a mask layer such that there are fewer holes in the region of the depressed area of the step compared with the region of the protruding portion; and a process of sequentially layering each of the layers of the columnar crystal structures, and causing growth of the columnar crystal structures to substantially the same height in the region of the depressed area and the region of the protruding portion.

By means of this configuration, in a compound semiconductor light emitting element in which a conductive substrate, or a conductive buffer layer on an insulating substrate, is comprised, an n-type semiconductor layer, light emitting layer, and p-type semiconductor layer are sequentially layered on the substrate which is provided on a side of one electrode, a plurality of columnar crystal structures of nanometer scale, called nano-columns or nano-rods, are formed, and the top portions of the columnar crystal structures are connected by another electrode; when causing growth of the columnar crystal structures, a substrate having a step is used and a porous mask layer is used, forming the mask layer only in the region which is a depressed area of the step without forming a mask layer in the region of the protruding portion, or forming the mask layer in both, but with fewer holes in the region of the depressed area of the step, that is, with a thicker mask layer, compared with the region of the protruding portion.

Hence the material for columnar crystal structures supplied onto the substrate diffuses over the mask layer surface and gathers at crystal nuclei in the region having the mask layer or the mask layer with fewer holes, and hastens growth of columnar crystal structures. By this means, even through a group of columnar crystal structures caused to grow over a prescribed time exists in the depressed area, the top portions connected to the other electrode can be made substantially the same height. In this way, at least two or more types of columnar crystal structures with different heights, that is, with different aspect ratios, and with different wavelengths of the maximum intensity of the spectrum of emitted light, can be formed. By this means, a solid-state light source producing white light or light of a desired hue can be fabricated simply on a single substrate and using a single growth process, and therefore at low cost. Further, a desired hue can be produced without using a phosphor, so that high reliability and a longer lifetime can be achieved, and moreover the areas of the protruding portion and the depressed area can be adjusted arbitrarily, so that the hue can be adjusted minutely and precisely according to the needs of the user.

As explained above, in a compound semiconductor light emitting element and a method of manufacture thereof in an aspect of the invention, in which a conductive substrate, or a conductive buffer layer on an insulating substrate, is comprised, an n-type semiconductor layer, light emitting layer, and p-type semiconductor layer are sequentially layered on the substrate which is provided on a side of one electrode, a plurality of columnar crystal structures of nanometer scale, called nano-columns or nano-rods, are formed, and the top portions of the columnar crystal structures are connected by another electrode; when causing growth of the columnar crystal structures, a substrate having a step is used and a porous mask layer is used, forming the mask layer only in the region which is a depressed area of the step without forming a mask layer in the region of the protruding portion, or forming the mask layer in both, but with fewer holes in the region of the depressed area of the step, that is, with a thicker mask layer, compared with the region of the protruding portion.

Hence the material for columnar crystal structures supplied onto the substrate gathers at crystal nuclei in the region having the mask layer or the mask layer with fewer holes, and growth of columnar crystal structures is faster; thus even through a group of columnar crystal structures caused to grow over a prescribed time exists in the depressed area, the top portions connected to the other electrode can be made substantially the same height. In this way, at least two or more types of columnar crystal structures with different heights, that is, with different aspect ratios, and with different wavelengths of the maximum intensity of the spectrum of emitted light, can be formed. By this means, a solid-state light source producing white light or light of a desired hue can be fabricated simply on a single substrate and using a single growth process, and therefore at low cost. Further, a desired hue can be produced without using a phosphor, so that high reliability and a longer lifetime can be achieved, and moreover the areas of the protruding portion and the depressed area can be adjusted arbitrarily, so that the hue can be adjusted minutely and precisely according to the needs of the user.

The invention claimed is:

1. A compound semiconductor light emitting element, comprising:
    a substrate which is provided on a side of one electrode;
    a plurality of columnar crystal structures of nanometer scale extending in a vertical direction on the substrate; and
    another electrode which interconnects top portions of the plurality of columnar crystal structures,
    wherein on the substrate are provided a first region, and a second region having a step between the first region and the second region and having a substrate thickness greater than that in the first region,
    a porous first mask layer is formed on a surface of the first region on the substrate, and
    the plurality of columnar crystal structures are formed by sequentially layering an n-type semiconductor layer, a light emitting layer, and a p-type semiconductor layer, in the first and second regions on the substrate.

2. The compound semiconductor light emitting element according to claim 1, wherein a porous second mask layer having a higher hole density than the first mask layer is formed on a surface of the second region on the substrate.

3. The compound semiconductor light emitting element according to claim 1, wherein the first mask layer is an Si oxide film.

4. The compound semiconductor light emitting element according to claim 2, wherein the first and second mask layers are Si oxide films, and the second mask layer is thinner than the first mask layer.

5. The compound semiconductor light emitting element according to claim 1, wherein ratios of the lengths and thicknesses of the columnar crystal structures provided in the first and second regions are respectively set such that wavelengths at which maximum intensity is exhibited in a spectrum of light emitted from the columnar crystal structures provided in the first and second regions are wavelengths of colors positioned at both ends of a straight line intersecting a white region in a CIE chromaticity diagram.

6. The compound semiconductor light emitting element according to claim 1, wherein a third region, which is at least a portion of the remaining region of the substrate excluding the first and second regions and which has steps between the first and second regions and the third region, is provided in the substrate, and ratios of the lengths and thicknesses of the columnar crystal structures in the first, second, and third regions are set such that wavelengths at which maximum intensity is exhibited in a spectrum of light emitted from the columnar crystal structures provided in the first, second and third regions are wavelengths of colors positioned at the vertices of a triangle enclosing a white region in a CIE chromaticity diagram.

7. An illuminating apparatus, using the compound semiconductor light emitting element according to claim 1.

8. A method for manufacturing a compound semiconductor light emitting element, comprising:
a step of forming, in a region of a portion of a substrate which is provided on a side of one electrode, a depressed area as a first region, to thereby form a step between the first region and a second region which is the remaining region;
a step of forming a porous first mask layer in a bottom portion of the depressed area which is the first region;
a growth step of sequentially layering, in the first and second regions, an n-type semiconductor layer, a light emitting layer, and a p-type semiconductor layer, and causing growth of a plurality of columnar crystal structures of nanometer scale to substantially the same height in the first region and the second region; and
a connection step of connecting top portions of the plurality of columnar crystal structures by another electrode.

9. The method for manufacturing a compound semiconductor light emitting element according to claim 8, further comprising, prior to the growth step, a step of forming, on the surface of the second region, a porous second mask layer having a higher hole density than the first mask layer.

10. The method for manufacturing a compound semiconductor light emitting element according to claim 8, wherein, when causing growth of the p-type semiconductor layer in the growth step, the p-type semiconductor layers in adjacent columnar crystal structures are caused to be joined together by gradually increasing the diameters of the plurality of columnar crystal structures, and in the connection step, top portions of the plurality of columnar crystal structures are connected by forming a transparent electrode layer on a surface of a p-type layer formed with the p-type semiconductor layers joined together.

* * * * *